(12) United States Patent
Bradley

(10) Patent No.: US 10,200,021 B1
(45) Date of Patent: Feb. 5, 2019

(54) SYNCHRONOUS N PULSE BURST GENERATOR

(71) Applicant: ANRITSU COMPANY, Morgan Hill, CA (US)

(72) Inventor: Donald Anthony Bradley, Morgan Hill, CA (US)

(73) Assignee: ANRITSU COMPANY, Morgan Hill, CA (US)

( * ) Notice: Subject to any disclaimer, the term of this patent is extended or adjusted under 35 U.S.C. 154(b) by 0 days.

(21) Appl. No.: 15/339,490

(22) Filed: Oct. 31, 2016

Related U.S. Application Data

(60) Provisional application No. 62/249,044, filed on Oct. 30, 2015.

(51) Int. Cl.
| | |
|---|---|
| *H03K 5/14* | (2014.01) |
| *H03K 19/20* | (2006.01) |
| *H03K 5/15* | (2006.01) |
| *H03K 5/00* | (2006.01) |

(52) U.S. Cl.
CPC ........... *H03K 5/14* (2013.01); *H03K 5/15046* (2013.01); *H03K 19/20* (2013.01); *H03K 2005/00078* (2013.01)

(58) Field of Classification Search
CPC .......... G01C 17/00; G01C 17/36; H03C 1/00; H03C 1/60; G06F 13/00; G06F 13/1689; G06F 13/4234; H03H 11/00; H03H 11/1213; H03K 19/00; H03K 19/20; H03K 2005/00; H03K 2005/00078; H03K 5/00; H03K 5/14; H03K 5/15046
USPC ....................................................... 327/235
See application file for complete search history.

(56) References Cited

U.S. PATENT DOCUMENTS

| | | | | |
|---|---|---|---|---|
| 5,654,767 | A | * 8/1997 | Ikeda | H04N 9/44 348/507 |
| 2012/0154187 | A1 | * 6/2012 | Dutton | G04F 10/005 341/118 |
| 2014/0236017 | A1 | * 8/2014 | Degertekin | A61B 8/12 600/462 |

* cited by examiner

*Primary Examiner* — Lincoln Donovan
*Assistant Examiner* — David Mattison
(74) *Attorney, Agent, or Firm* — Tucker Ellis LLP

(57) ABSTRACT

In accordance with an embodiment, a synchronous N pulse burst generator includes an input for an intermediate frequency trigger signal and a signal path extending from the input. The signal path includes a series of N AND gates and an OR gate. Each AND gate is arranged to receive two inputs from the signal path. The signal path introduces a time delay between the two inputs received by each AND gate. A second input of the two inputs is inverted. The signal path introduces the time delay between successive AND gates from the series of N AND gates. An OR gate receives outputs from the series of N AND gates and outputs an A/D clock signal.

13 Claims, 5 Drawing Sheets

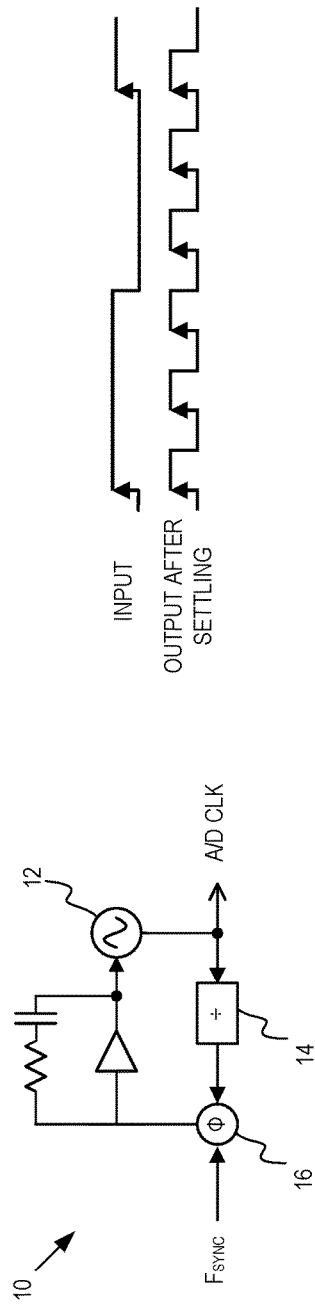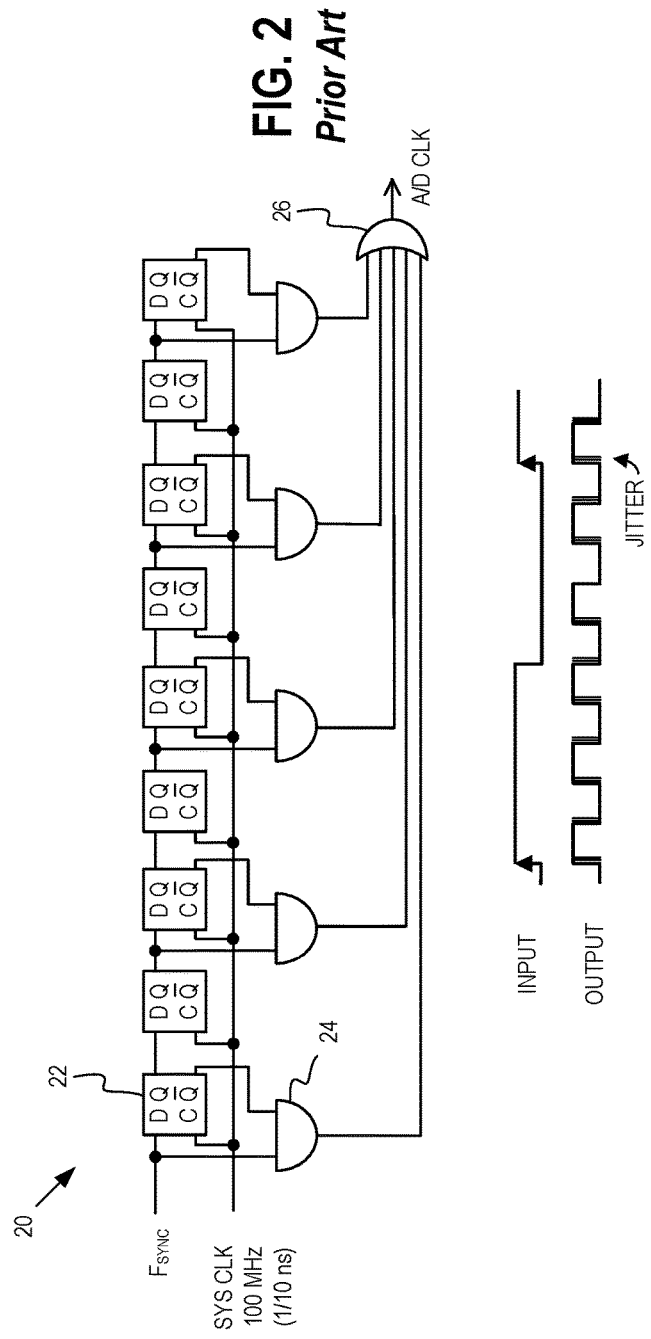

FOR F_IF FREQUENCIES DIFFERENT THAN THE DESIGNED 10 MHz F_IF
USE Φ = 7.2*F (MHz) FOR A/D Φ & MAG CALCULATIONS

SYNCHRONOUS N PULSE BURST GENERATOR

CLAIM OF PRIORITY

This application claims the benefit of priority to U.S. Provisional Application titled "SYNCHRONOUS N PULSE BURST GENERATOR", Application No. 62/249,044, filed Oct. 30, 2015, which application is herein incorporated by reference.

TECHNICAL FIELD

The present invention relates generally to pulse generators.

BACKGROUND

Radio, telecommunications, computers and other electronic applications rely on pulse generators, for example for sampling received signals. A pulse generator is either a circuit or a piece of electronic test equipment that is used to generate an output signal comprising rectangular pulses whose phase is synchronized to the phase of an input signal.

Synchronous burst generators currently used in most applications consist of either a phase locked loop (PLL) or a digital burst pulse generator. A PLL comprises a phase detector that aligns the edge of an input pulse trigger with the first of the N burst pulses. A digital burst pulse generator is derived from an internal time base. There are disadvantages to both synchronous burst generators that embodiments of the present invention are directed to improving upon.

SUMMARY

In accordance with an embodiment, a synchronous N pulse burst generator includes an input for an intermediate frequency trigger signal and a signal path extending from the input. The signal path includes a series of N AND gates and an OR gate. Each AND gate is arranged to receive two inputs from the signal path. The signal path introduces a time delay between the two inputs received by each AND gate. A second input of the two inputs is inverted. The signal path introduces the time delay between successive AND gates from the series of N AND gates. An OR gate receives outputs from the series of N AND gates and outputs an A/D clock signal. In accordance with an embodiment, the time delay is introduced by one or both of a delay line and a logic cell.

BRIEF DESCRIPTION OF THE DRAWINGS

Further details of the present invention are explained with the help of the attached drawings in which:

FIG. 1 illustrates a synchronous burst generator comprising a phase lock loop (PLL), in accordance with the prior art.

FIG. 2 illustrates a synchronous burst generator comprising a digital burst pulse generator, in accordance with the prior art.

DETAILED DESCRIPTION

Figure 3:
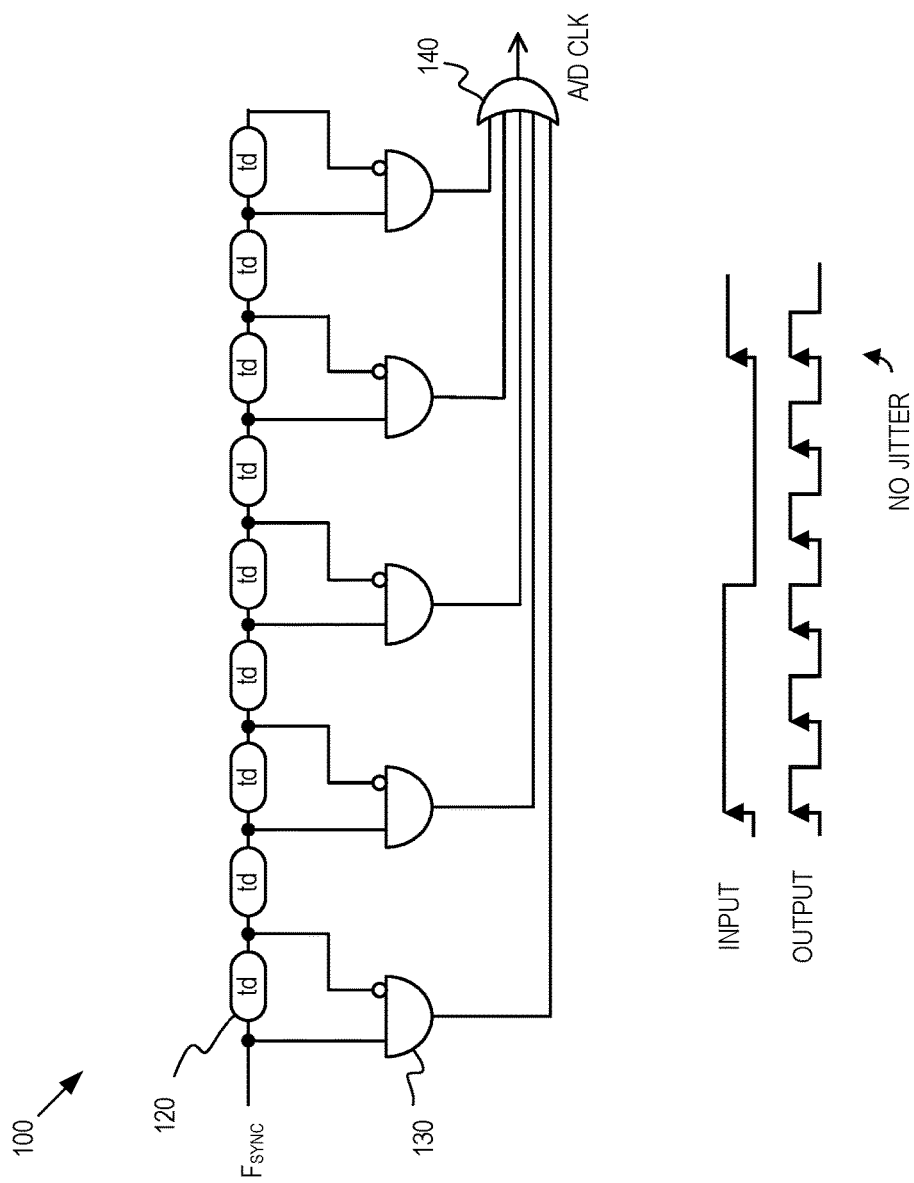
FIG. 3 illustrates a synchronous pulse burst generator, in accordance with an embodiment.

The following description is of the best modes presently contemplated for practicing various embodiments of the present invention. The description is not to be taken in a limiting sense but is made merely for the purpose of describing the general principles of the invention. The scope of the invention should be ascertained with reference to the claims. In the description of the invention that follows, like numerals or reference designators will be used to refer to like parts or elements throughout.

In the following description, numerous specific details are set forth to provide a thorough description of the invention. However, it will be apparent to those skilled in the art that the invention may be practiced without these specific details. In other instances, well-known features have not been described in detail so as not to obscure the invention.

Referring to FIG. 1, a PLL includes a variable frequency oscillator 12, a frequency divider 14, and a phase detector 16 that aligns the edge of the input pulse trigger with the first of the N burst pulses. As an example, an input frequency ($F_{SYNC}$) of 10 MHz, a frequency divider that divides by fives, and an oscillator having a frequency of 50 MHz produces an analog-to-digital (A/D) clock signal (A/D CLK) with a frequency five times the input and phase synchronous with the input frequency as the phase detector matches up the positive edges of the input and output signals.

Disadvantages of using a PLL as a pulse generator include long lock time, lock detection and slow acquisition. If there is no input frequency, the oscillator may be free running at some frequency (e.g., 51 MHz or 49 MHz). When the input frequency ($F_{SYNC}$) (e.g., 50 MHz) is applied to the circuit, the input frequency has to be acquired and then locked on to. This process can take, for example, 10 to 20 cycles of input before the positive edges of the input and output are aligned.

Referring to FIG. 2, a digital burst pulse generator 20 is derived from an internal time base providing a system clock signal (SYS CLK). The digital burst pulse generator comprises a series of D flip-flop circuits 22. Each D flip-flop captures the value of the D-input at a definite portion of the clock cycle (such as the rising edge of the clock). As shown, with a system clock signal of 100 MHz, the D flip flop introduces 10 ns of delay between the input signal ($F_{SYNC}$) and the output signal of the D flip flop. An AND gate 24 outputs a 10 ns pulse from the input signal and the output signal of the D flip flop. The output signals of the AND gates are provided to an OR gate 26 to produce an A/D clock signal (A/D CLK).

A disadvantage of the digital burst pulse generation is that an incoming trigger pulse is asynchronous with the internal time base. For example, if the system clock frequency is 100 MHz and the input frequency ($F_{SYNC}$) is 10 MHz+1 Hz, then a count is skipped every second because the 100 MHz is actually sampling the input. The D flip flops are instantaneous samplers, transferring the input at D to Q on the positive edge of the clock. If the input on D is slightly ahead of the clock, the input will not be seen and the input signal would be skipped. This results in phase error jitter when the output is used as the clock for an A/D converter.

FIG. 3 illustrates a synchronous N pulse burst generator 100, in accordance with an embodiment. The pulse burst generator introduces N time delays (td) 120 between the generator input and the generator output. The time delays are substantially uniform and can be implemented in logic cells, delay lines, or both. The pulse burst generator provides instantaneously or near instantaneously generated N burst pulses substantially synchronous with a leading edge of an input trigger pulse ($F_{SYNC}$). A leading edge of a trigger pulse is the leading edge of first burst pulse and any integer number of pulses can be generated. Because the leading edge of leading edge of an input trigger pulse is used to produce each burst pulse, there is no jitter in the output, and no time delay. With no time delay, synchronous N pulse burst generators in accordance with embodiments, for example, measurement instruments to perform fast sweep times from point to point.

As shown in FIG. 3, the pulse burst generates N=5 pulse bursts. Although, in other embodiments some other number of samples can be used, and thus the number of bursts can vary. The pulse burst generate could be used to generate 4 bursts or 8 burst, for example. The number of time delays and the length of the time delays would be determined based on the number of bursts. Each pulse burst is generated by the output of an AND gate 130 with one input comprising the input trigger pulse and the other input comprising the inverted input trigger pulse delayed by the time delay (td). The pulses are each delayed by a time delay (td) and the output signals of the AND gates are provided to an OR gate 140 to produce an A/D clock signal (A/D CLK).

Figure 4:
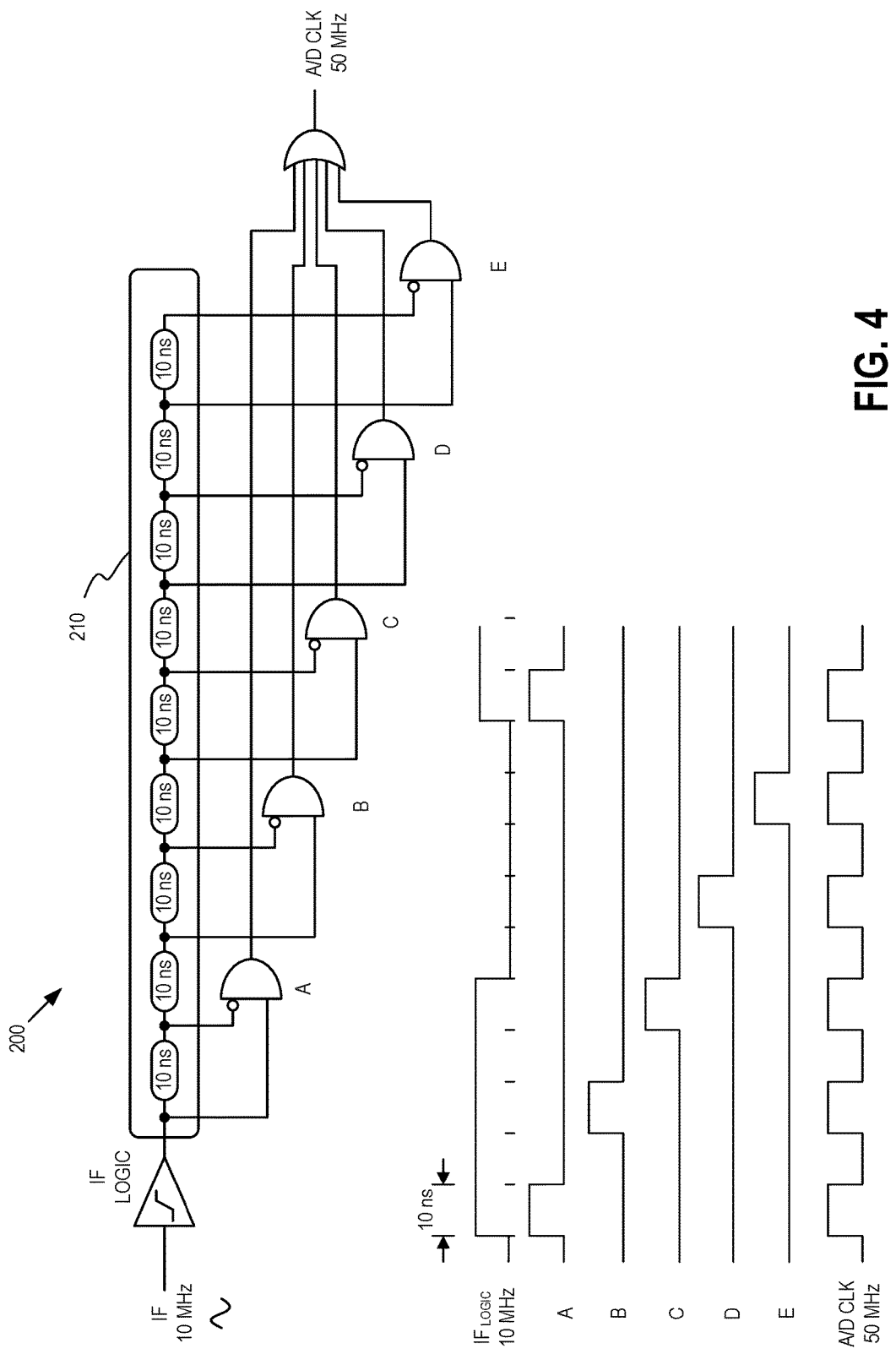
FIG. 4 illustrates a synchronous pulse burst generator based on a delay line, in accordance with an embodiment.

FIG. 4 illustrates an exemplary implementation of a synchronous N pulse burst generator 200, in accordance with an embodiment. The synchronous N pulse burst generator comprises a delay line 210 that introduces a series of time delays with the burst generator tapping the delay line at nine points. The input to each time delay and the output to each time delay is tapped and provided to an AND gate as an input to the AND gate comprising the leading edge of the input signal and an inverted signal of the leading edge of the input signal. The output of the AND gates (A-E) are provided to an OR gate, producing an A/D clock signal (A/D CLK).

In the example shown in FIG. 4, if an input signal comprising an intermediate frequency (IF) signal of 10 MHz is provided to a delay line comprising nine time delays of 10 ns each, the generator outputs an A/D clock signal (A/D CLK) at 50 MHz by summing the outputs of the nine AND gates, as shown. The inverted input signal provided as the second input to the AND gate is generated by the time delay of the delay line. One exemplary delay line capable of being used with embodiments is an integrated circuit (IC). Once such IC is a Maxim DS1110LE-100 available from Dallas Semiconductor. The delay lines could alternatively be an actual physical delay. For example, delay through a coax cable is approximately a nanosecond per foot of length. The physical delay line can thus comprise one foot of coaxial cable introduced between taps for each time delay.

Figure 5:
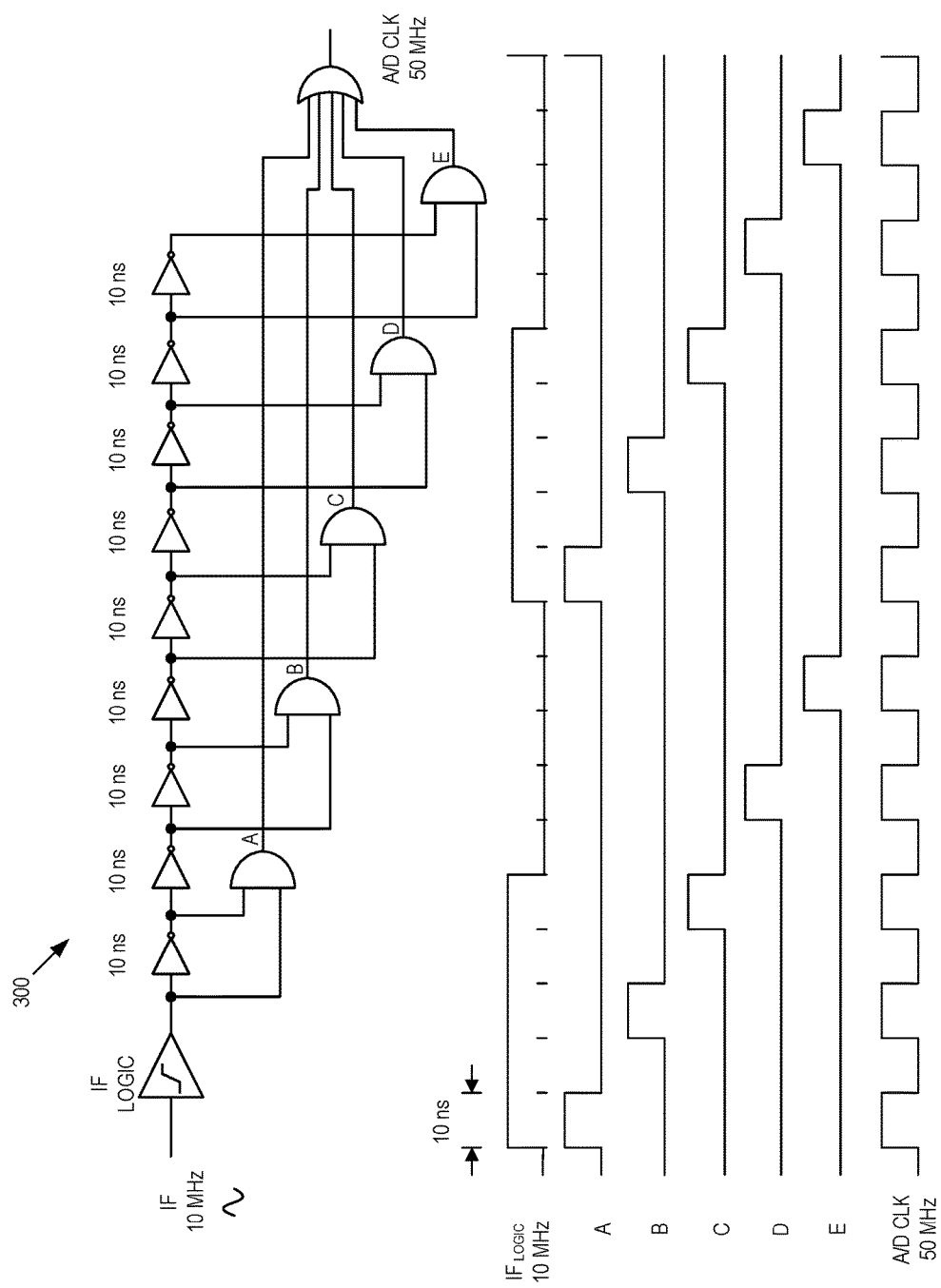
FIG. 5 illustrates a synchronous pulse burst generator based on a series of logic gates, in accordance with an embodiment.

FIG. 5 illustrates a specific exemplary implementation of a synchronous N pulse burst generator comprising time delays each produced by a logic delay. Each logic delay is a NOT gate (i.e., an inverter) that produces an inverted signal for input into an AND gate with an internal delay of 10 ns. Thus, the input to each invert and the output to each inverter is tapped and provided to an AND gate as an input to the AND gate comprising the leading edge of the input signal and an inverted signal of the leading edge of the input signal. The output of the AND gates (A-E) are provided to an OR gate, producing an A/D clock signal (A/D CLK).

In the example shown in FIG. 5, if an input signal comprising an intermediate frequency (IF) signal of 10 MHz is provided to a series of nine inverters each comprising delays of 10 ns, the generator outputs an A/D clock signal (A/D CLK) at 50 MHz by summing the outputs of the nine AND gates, as shown.

Figure 6:
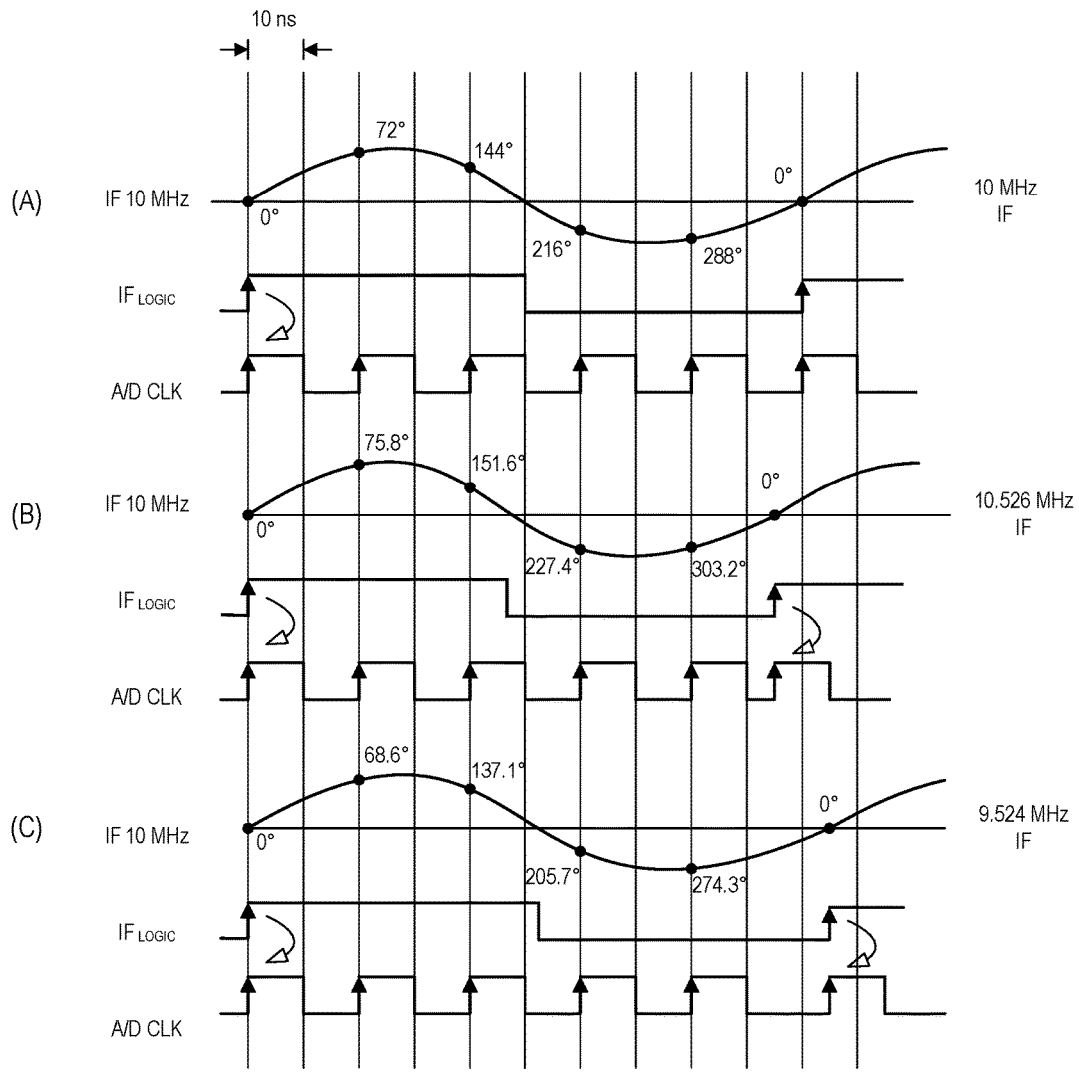
FIG. 6 illustrates generation of bursts for an intermediate frequency signal with varying trigger periods.

As mentioned, embodiments of pulse burst N generators can be used with varying trigger periods. FIG. 6 illustrates an IF signal having a frequency of 10 MHz (A), an IF signal having a frequency of 10.526 MHz (B), and an IF signal having a frequency of 9.524 MHz (C). However, the time delays and pulses chosen such that the output frequency is five times (5×) the input frequency. If the input frequency is something other than the time delays set up in the circuit, then exactly five pulses per period are not produced. Rather, five pulses, plus or minus are generated. As shown in (B) and (C), the five pulses generated by the leading edge of the input signal creates another five pulses that are either earlier and thus determined by the early arrival of the first of the next five pulses (B) or later and thus determined by the late arrival of the first of the next five pulses (C).

The frequency of the signal where it is sampled by the A/D is therefore at different phases. Those phases should be determined to perform calculations of sine and cosine for magnitude and phase measurements. The frequency is known and the samples are known because the time delay is set up as 10 ns. Using a simple formula, the frequency is multiplied by 7.2 and determined the phases are to be used in the calculation of the measurement out of the A/D. Thus, for IF frequencies different than the designed 10 MHz IF frequency ($F_{IF}$) a phase of 7.2×F (in MHz) is used for A/D phase and magnitude calculations.

In some embodiments, the present invention includes a computer program product which is a storage medium or computer readable medium (media) having instructions stored thereon/in which can be used to program a computer to perform any of the processes of the present invention. The storage medium can include, but is not limited to, any type of disk including floppy disks, optical discs, DVD, CD-ROMs, microdrive, and magneto-optical disks, ROMs, RAMs, EPROMs, EEPROMs, DRAMs, VRAMs, flash memory devices, magnetic or optical cards, nanosystems (including molecular memory ICs), or any type of media or device suitable for storing instructions and/or data.

The previous description of the preferred embodiments is provided to enable any person skilled in the art to make or use the embodiments of the present invention. While the invention has been particularly shown and described with reference to preferred embodiments thereof, it will be understood by those skilled in the art that various changes in form and details may be made therein without departing from the spirit and scope of the invention.

The invention claimed is:

1. A synchronous N pulse burst generator for generating an analog-to-digital (A/D) clock signal from a trigger signal, comprising:

an input for the trigger signal, wherein the trigger signal comprises an intermediate frequency (IF) signal;

a signal path extending from the input;

a series of N AND gates, each AND gate arranged along the signal path to receive a first input from the trigger signal propagating along the signal path and a second input from the trigger signal propagated further along the signal path, wherein the trigger signal as received as the first input is inverted as received as the second input, wherein the signal path introduces a time delay in propagation of the trigger signal between the first input and the second input received by each AND gate, the time delay being based on a target frequency of the A/D clock signal, and wherein the signal path further introduces the time delay in propagation of the trigger signal between the second input of an AND gate and the first input of a successive AND gate from the series of N AND gates; and an OR gate that receives outputs from the series of N AND gates and outputs the A/D clock signal.

2. The synchronous N pulse burst generator of claim 1, wherein the time delay is introduced by a delay line, and wherein inputs for each of the N AND gates are connected to successive taps of the delay line separated by the time delay.

3. The synchronous N pulse burst generator of claim 1, wherein the delay is introduced by a logic cell, and wherein a logic cell is connected between inputs of the N AND gates and between each of the N AND gates.

4. The synchronous N pulse burst generator of claim 3, wherein the logic cell is an inverter.

5. A synchronous N pulse burst generator for generating an analog-to-digital (A/D) clock signal from a trigger signal, comprising:

an input for the trigger signal, wherein the trigger signal comprises an intermediate frequency (IF) signal;

a delay line extending from the input;

a series of N AND gates, each AND gate arranged along the delay line to receive a first input from the trigger signal propagating along the delay line and a second input from the trigger signal propagated further along the delay line, wherein the trigger signal as received as the first input is inverted as received as the second input, wherein the delay line introduces a time delay between the first input and the second input received by each AND gate, and wherein the delay line further introduces the time delay in propagation of the trigger signal between the second input of an AND gate and the first input of a successive AND gate from the series of N AND gates; and an OR gate that receives outputs from the series of N AND gates and outputs the A/D clock signal.

6. The synchronous N pulse burst generator of claim 1, wherein the number, N, of the series of N AND gates is based on a target frequency of the trigger signal.

7. The synchronous N pulse burst generator of claim 6, wherein the target frequency of the trigger signal is 10 MHz,
the number, N, of the series of N AND gates is 5,
the time delay is 10 ns, and
the target frequency of the A/D clock signal is 50 MHz.

8. The synchronous N pulse burst generator of claim 5, wherein inputs for each of the N AND gates are connected to successive taps of the delay line separated by the time delay.

9. The synchronous N pulse burst generator of claim 5, wherein the number, N, of the series of N AND gates is based on a target frequency of the trigger signal.

10. The synchronous N pulse burst generator of claim 8, wherein the target frequency of the trigger signal is 10 MHz,
the number, N, of the series of N AND gates is 5,
the time delay is 10 ns, and
the target frequency of the A/D clock signal is 50 MHz.

11. A method of generating an analog-to-digital (A/D) clock signal from a trigger signal, comprising:

generating an intermediate frequency (IF) signal within a measurement instrument for use as the trigger signal;

providing the trigger signal to a synchronous N pulse burst generator, wherein the synchronous N pulse burst generator includes an input for the trigger signal, a signal path extending from the input, a series of N AND gates, each AND gate arranged along the signal path to receive a first input from the trigger signal propagating along the signal path and a second input from the trigger signal propagated further along the signal path, wherein the trigger signal as received as the first input is inverted as received as the second input, wherein the signal path introduces a time delay in propagation of the trigger signal between the first input and the second input received by each AND gate, the time delay being based on a target frequency of the A/D clock signal, and wherein the signal path further introduces the time delay in propagation of the trigger signal between the second input of an AND gate and the first input of a successive AND gate from the series of N AND gates, and an OR gate that receives outputs from the series of N AND gates and outputs the A/D clock signal; and using the A/D clock signal output by the synchronous N pulse burst generator to synchronize components of the measurement instrument.

12. The method of claim 11, wherein the number, N, of the series of N AND gates of the synchronous N pulse burst generator is based on a target frequency of the trigger signal.

13. The method of claim 12, wherein the target frequency of the trigger signal is 10 MHz,
the number, N, of the series of N AND gates is 5,
the time delay is 10 ns, and
the target frequency of the A/D clock signal is 50 MHz.

* * * * *